United States Patent
Kai et al.

(10) Patent No.: US 8,208,292 B2
(45) Date of Patent: Jun. 26, 2012

(54) MAGNETORESISTIVE ELEMENT AND MAGNETIC MEMORY

(75) Inventors: Tadashi Kai, Tokyo (JP); Katsuya Nishiyama, Yokohama (JP); Toshihiko Nagase, Yokohama (JP); Masatoshi Yoshikawa, Yokohama (JP); Eiji Kitagawa, Yokohama (JP); Tadaomi Daibou, Yokohama (JP); Makoto Nagamine, Komae (JP); Masahiko Nakayama, Yokohama (JP); Naoharu Shimomura, Tokyo (JP); Hiroaki Yoda, Sagamihara (JP); Kei Yakushiji, Tsukuba (JP); Shinji Yuasa, Tsukuba (JP); Hitoshi Kubota, Tsukuba (JP); Taro Nagahama, Tsukuba (JP); Akio Fukushima, Tsukuba (JP); Koji Ando, Tsukuba (JP)

(73) Assignees: Kabushiki Kaisha Toshiba, Tokyo (JP); National Institute of Advanced Industrial Science and Technology, Tokyo (JP)

( * ) Notice: Subject to any disclaimer, the term of this patent is extended or adjusted under 35 U.S.C. 154(b) by 0 days.

(21) Appl. No.: 13/342,324

(22) Filed: Jan. 3, 2012

(65) Prior Publication Data

US 2012/0099369 A1    Apr. 26, 2012

Related U.S. Application Data

(63) Continuation of application No. 12/879,544, filed on Sep. 10, 2010, now Pat. No. 8,107,281.

(30) Foreign Application Priority Data

Sep. 25, 2009    (JP) .................................. 2009-221569

(51) Int. Cl.
    *G11C 11/00*    (2006.01)

(52) U.S. Cl. .......... 365/158; 365/148; 365/171; 977/935
(58) Field of Classification Search .................. 365/48, 365/55, 62, 66, 74, 78, 80–93, 100, 130, 365/131, 148, 158, 171–173, 209, 213, 225.5, 365/230.07, 232, 243.5; 216/22; 257/421, 257/E21.665; 483/3; 428/810–816, 817–825.1, 428/826; 977/933–935
See application file for complete search history.

(56) References Cited

U.S. PATENT DOCUMENTS 5,801,984 A * 9/1998 Parkin ............................ 365/158
(Continued)

FOREIGN PATENT DOCUMENTS

JP    2002-352408    12/2002
(Continued)

OTHER PUBLICATIONS

U.S. Appl. No. 13/043,064, filed Mar. 8, 2011, Daibou, et al.
(Continued)

*Primary Examiner* — Alexander Sofocleous
*Assistant Examiner* — Harry W Byrne
(74) *Attorney, Agent, or Firm* — Oblon, Spivak, McClelland, Maier & Neustadt, L.L.P.

(57) ABSTRACT

According to one embodiment, a magnetoresistive element includes a first magnetic layer with a variable magnetization and an easy-axis in a perpendicular direction to a film surface, a second magnetic layer with an invariable magnetization and an easy-axis in the perpendicular direction, and a first nonmagnetic layer between the first and second magnetic layers. The first magnetic layer comprises a ferromagnetic material including an alloy in which Co and Pd, or Co and Pt are alternately laminated on an atomically close-packed plane thereof. The first magnetic layer has C-axis directing the perpendicular direction. And a magnetization direction of the first magnetic layer is changed by a current flowing through the first magnetic layer, the first nonmagnetic layer and the second magnetic layer.

15 Claims, 9 Drawing Sheets

U.S. PATENT DOCUMENTS

| | | | |
|---|---|---|---|
| 6,074,707 A * | 6/2000 | Nakazawa et al. | 427/547 |
| 6,256,223 B1 | 7/2001 | Sun | |
| 6,777,730 B2 * | 8/2004 | Daughton et al. | 257/295 |
| 6,881,497 B2 * | 4/2005 | Coffey et al. | 428/828.1 |
| 6,950,260 B2 * | 9/2005 | Coffey et al. | 360/59 |
| 7,663,197 B2 | 2/2010 | Nagase et al. | |
| 7,897,274 B2 * | 3/2011 | Yuasa et al. | 428/811.3 |
| 8,036,025 B2 | 10/2011 | Nagase et al. | |
| 2002/0191320 A1 * | 12/2002 | Coffey et al. | 360/59 |
| 2002/0192506 A1 * | 12/2002 | Coffey et al. | 428/694 TM |
| 2003/0048676 A1 * | 3/2003 | Daughton et al. | 365/200 |
| 2004/0185306 A1 * | 9/2004 | Coffey et al. | 428/694 TM |
| 2007/0297103 A1 * | 12/2007 | Zhang et al. | 360/324.12 |
| 2009/0080239 A1 | 3/2009 | Nagase et al. | |
| 2010/0118600 A1 | 5/2010 | Nagase et al. | |
| 2011/0007560 A1 * | 1/2011 | Dieny et al. | 365/171 |

FOREIGN PATENT DOCUMENTS

| | | |
|---|---|---|
| JP | 2007-142364 | 6/2007 |
| JP | 2008-72014 | 3/2008 |
| JP | 2008-252018 | 10/2008 |

OTHER PUBLICATIONS

J. C. Slonczewski, "Current-driven excitation of magnetic multilayers", Journal of Magnetism and Magnetic Materials, 159, Letter to Editor, Elsevier, 1996, pp. L1-L7.

K. Yakushiji, et al., "Perpendicular-MgO-MTJs with hcp-c-plane oriented [Co/Pt] superlattice", National Institute of Advanced Industrial Science and Technology (AIST), 2010, 2 pages.

K. Yakushiji, et al., "Preparation of an fcc-based CoPt thin film a perpendicular-MTJ device" (1 a-TB-2), 2009, p. 781.

Office Action issued Jun. 28, 2011 in Japanese Patent Application No. 2009-221569 filed Sep. 25, 2009 (wi/English translation).

Gunn Choe et al., Epitaxially Grown FCC/BCC/HCP Multi-Underlayers for High Performance Perpendicular Media, IEEE Transactions on Magnetics, Nov. 2008, vol. 44, No. 11, pp. 3499-3502.

Office Action issued May 8, 2012 in Japanese Application No. 2009-221569 filed Sep. 25, 2009 (w/English translation).

* cited by examiner

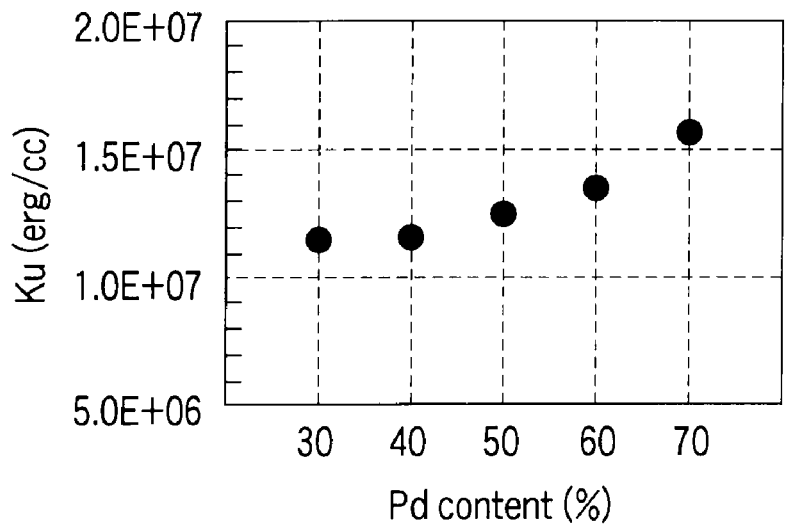
F I G. 5
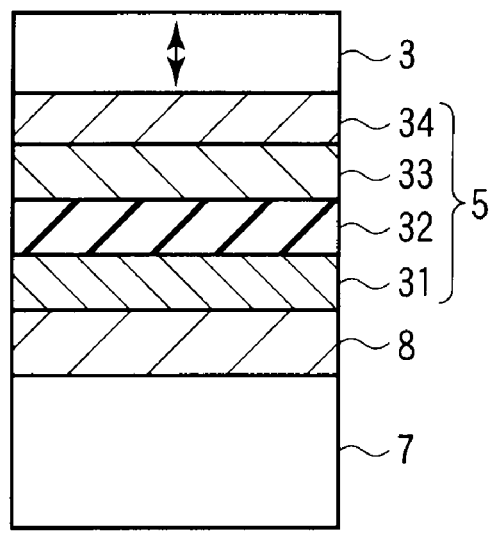
F I G. 6

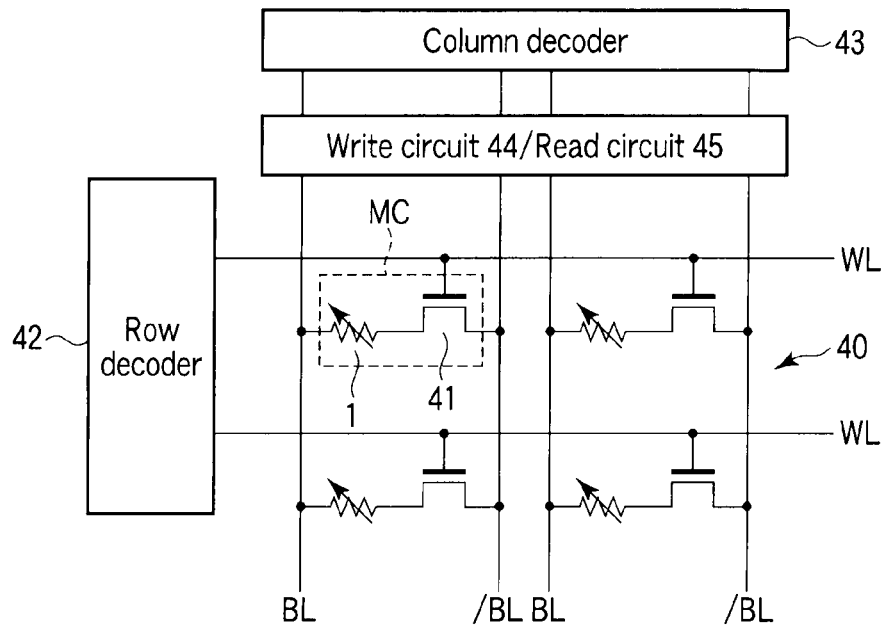
F I G. 7
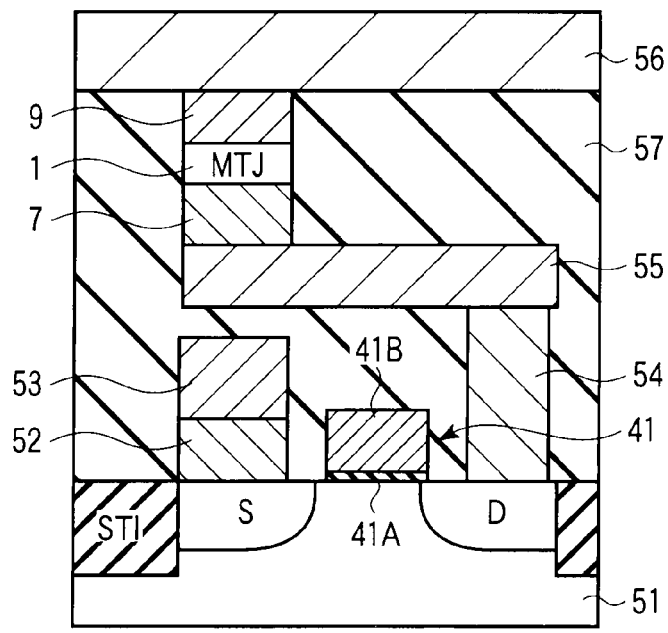
F I G. 8

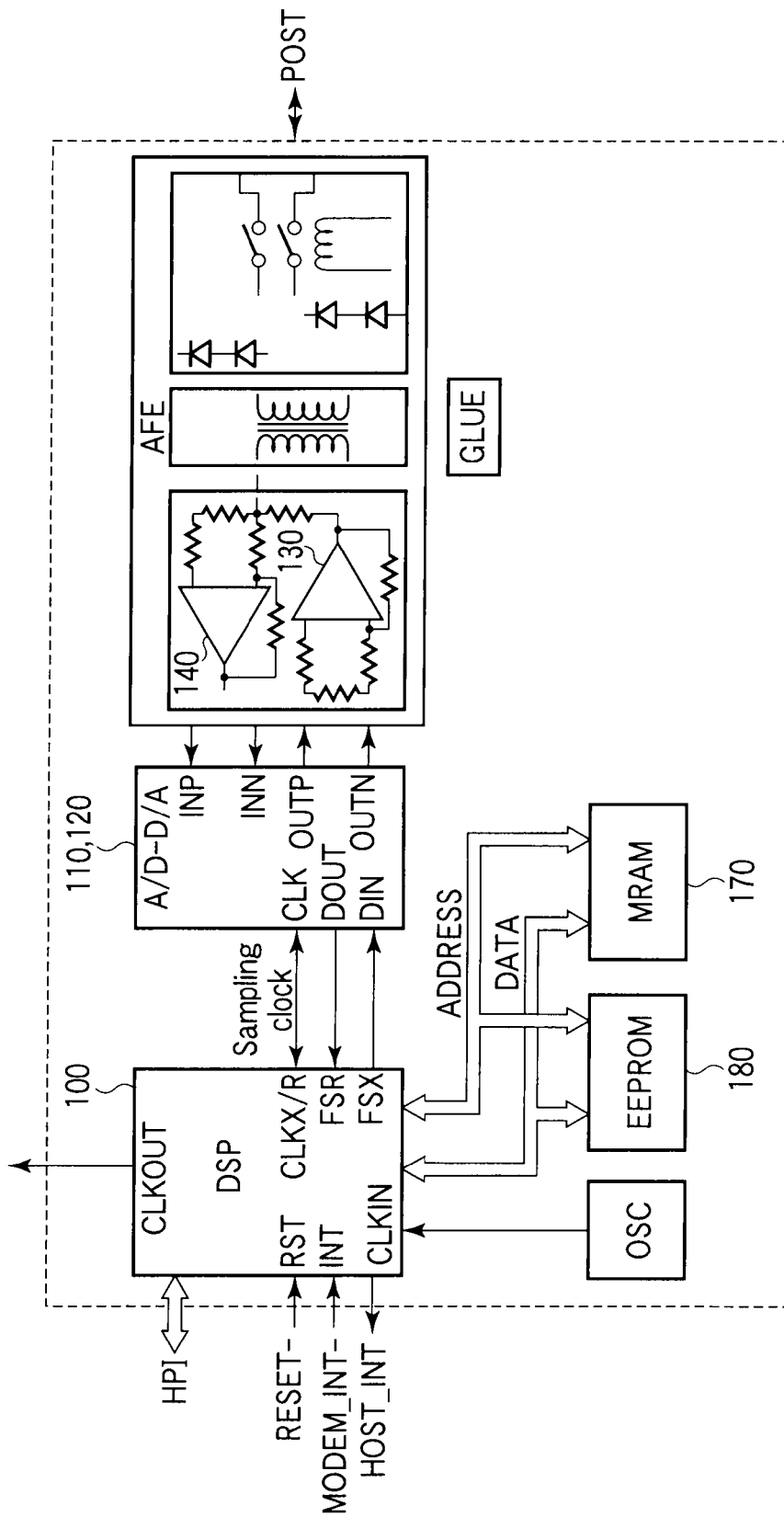
F I G. 9

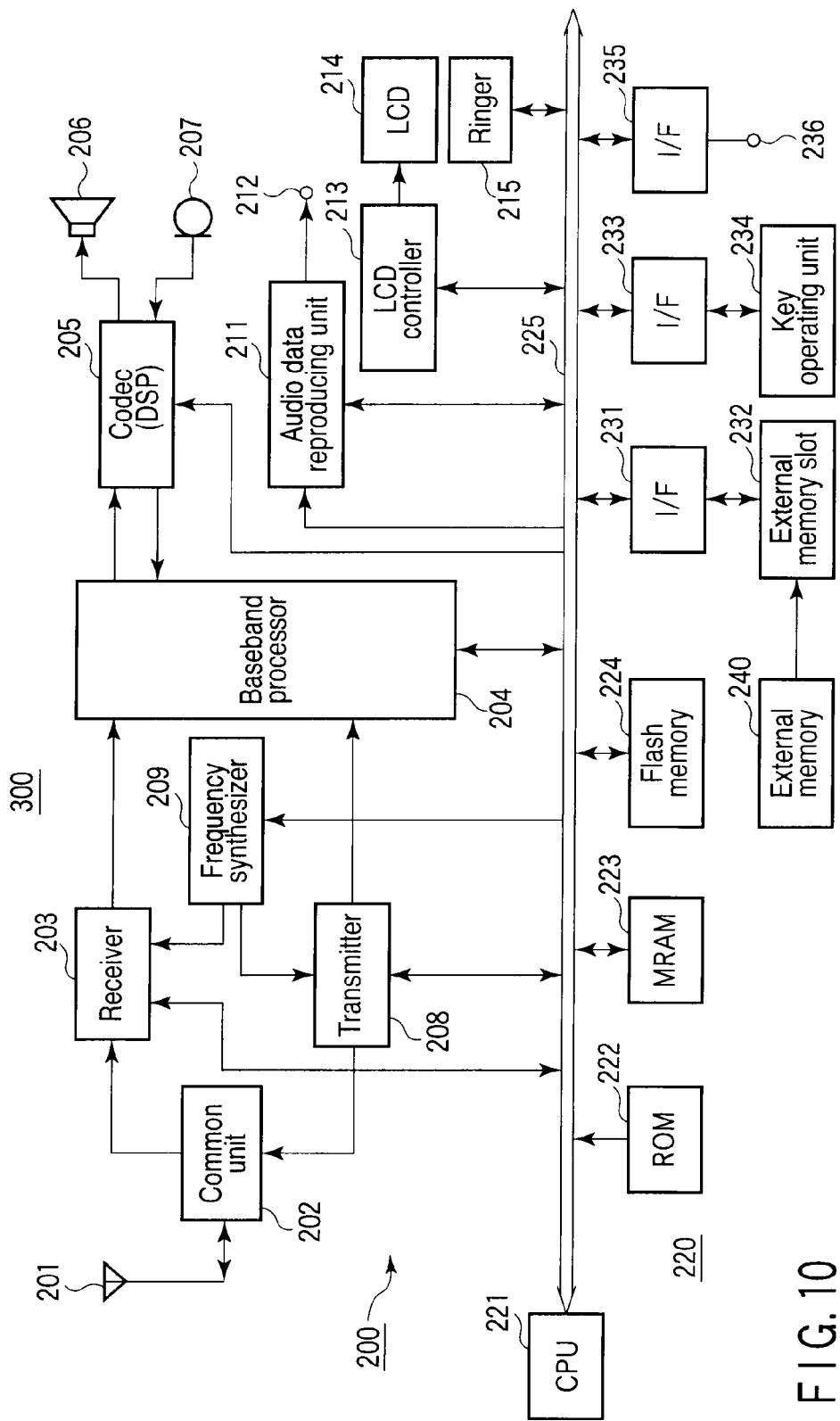
F I G. 10

MAGNETORESISTIVE ELEMENT AND MAGNETIC MEMORY

CROSS-REFERENCE TO RELATED APPLICATIONS

This application is a continuation of and claims the benefit of priority under 35 U.S.C. §120 from U.S. Ser. No. 12/879,544 filed Sep. 10, 2010, and claims the benefit of priority under 35 U.S.C. §119 from Japanese Patent Application No. 2009-221569 filed Sep. 25, 2009, the entire contents of each of which are incorporated herein by reference.

FIELD

Embodiments described herein relate generally to a magnetoresistive element and a magnetic memory.

BACKGROUND

In recent years, as a next-generation high-capacity solid nonvolatile memory that can perform high-speed reading/writing and low-power consumption operations, a magnetic random access memory (which will be referred to as an MRAM hereinafter) utilizing a magnetoresistance effect of a ferromagnetic material has attracted a great deal of interest. In particular, a magnetoresistive element having a ferromagnetic tunnel junction has drawn attention since it was discovered that it has a high magnetoresistance change ratio.

The ferromagnetic tunnel junction basically has a three-layer laminated structure including a storage layer having a variable magnetization direction, an insulator layer and a fixed layer that faces the storage layer and maintains a predetermined magnetization direction. When a current is flowed through this ferromagnetic tunnel junction, the current tunnels through the insulator layer to flow. At this time, the resistance in the junction unit changes depending on a relative angle of the magnetization directions of the storage layer and the fixed layer, and it takes a minimal value when the magnetization directions are parallel whilst it takes a maximal value when these directions are anti-parallel.

This change in resistance is called a tunneling magnetoresistance effect (which will be referred to as a TMR effect hereinafter). When actually using a magnetoresistive element having a ferromagnetic tunnel junction as one memory cell, a parallel state and an anti-parallel state of magnetization (i.e., a relative minimum and a relative maximum of resistance) of the storage layer and the fixed layer are associated with binary information "0" and "1", respectively, thereby storing information.

In regard to writing of stored contents in the magnetoresistive element, there is known a magnetic field write system by which a write wiring line is arranged near a memory cell and a magnetization direction of a storage layer alone is reversed by using a current magnetic field produced when flowing a current.

However, when an element size is reduced to realize a high-capacity memory, the coercive force (Hc) of a magnetic material constituting the storage layer increases in principle, and hence there is a tendency that a current required for writing is increased as the element is miniaturized. Further, since the current magnetic field from the writing wiring line decreases in principle with respect to a reduction in cell size, achieving both the reduction in cell size and the decrease in writing current required for high-capacity design is difficult in the magnetic field write system.

On the other hand, in recent years, as a write system that overcomes this problem, a write (spin injection write) system using spin momentum transfer (SMT) is suggested. According to this system, a spin polarized current is flowed through a magnetoresistive element to reverse a magnetization direction of a storage layer, and a quantity of spin polarized electrons to be injected can be reduced as a volume of a magnetic layer forming the storage layer is small. Therefore, this system is expected as a write system that can achieve both miniaturization of the element and realization of a low current.

However, when the element is miniaturized to achieve a high capacity, an energy barrier that maintains the magnetization direction of the storage layer in one direction, i.e., the magnetic anisotropic energy becomes smaller than the thermal energy, whereby a problem that a magnetization direction of a magnetic material sways (thermal disturbance) and stored information can be no longer maintained becomes obvious.

In general, since the energy barrier required for the magnetization direction reversal is represented as a product of a magnetic anisotropic constant (magnetic anisotropic energy per unit volume) and a magnetization reversal unit volume, a material having a high magnetic anisotropic constant must be selected to assure resistance against thermal disturbance in a fine element size region.

In an in-plane magnetization type configuration mainly examined in conventional examples, shape magnetic anisotropy is generally utilized. In this case, to increase the magnetic anisotropic energy, countermeasures such as an increase in aspect ratio of a magnetoresistive element, an increase in film thickness of a storage layer, an increase in saturated magnetization of the storage layer and other measures are required. However, when considering the characteristics of the spin injection system, these countermeasures lead to an increase in inversion current, and hence they are not suitable for miniaturization.

On the other hand, utilizing a material having high crystal magnetic anisotropy rather than the shape magnetic anisotropy can be also considered. In this case, however, an easy-axis (an axis of easy magnetization) in an in-plane direction is greatly decentralized within a film surface, and hence an MR ratio (Magnetoresistance ratio) is lowered or incoherent precessional movement is induced, thereby increasing an inversion current. Therefore, this countermeasure is not preferable either.

Furthermore, in the in-plane magnetization configuration, the magnetic anisotropy that arises based on a shape is utilized, and hence the inversion current is sensitive to unevenness in shape. As a result, when the unevenness in shape increases with miniaturization, unevenness in inversion current also increases.

On the other hand, as a ferromagnetic material constituting a magnetoresistive element, using a so-called perpendicular magnetization film having an easy-axis along a film surface perpendicular direction can be considered. When utilizing the crystal magnetic anisotropy in the perpendicular magnetization type configuration, since the shape anisotropy is not used, an element shape can be reduced to be smaller than that in the in-plane magnetization type configuration. Moreover, since the decentralization of the magnetization easy direction can be also reduced, it can be expected that adopting a material having the high crystal magnetic anisotropy enables achieving both the miniaturization and a low current while maintaining the resistance against the thermal disturbance.

Examples of materials used for the perpendicular magnetization film include $L1_o$ ordered alloy series (FePt, CoPt and others), artificial lattice series (Co/Pt, Pd), hcp series (CoPt and others), and RE-TM series (Tb—CoFe and others).

In general, the inversion current required to enable reverse magnetization by the spin injection system is dependent on saturated magnetization Ms and a magnetic relaxation constant α of a storage layer. Therefore, to reverse the magnetization of the storage layer by the spin injection of a low current, reducing the saturated magnetization Ms and the magnetic relaxation α is important. Moreover, a device must resist a working process temperature. However, none of currently known perpendicular magnetization films can satisfy characteristics as the storage layer.

BRIEF DESCRIPTION OF THE DRAWINGS

FIG. 5 shows the Pd concentration dependence of perpendicular magnetic anisotropic energy;

FIG. 6 is a cross-sectional view showing a laminated structure including an underlying layer and a storage layer of the first embodiment;

FIG. 7 is a circuit diagram showing an MRAM of a second embodiment;

FIG. 8 is a cross-sectional view showing one memory cell MC;

FIG. 9 is a block diagram showing a DSL data path unit of a DSL modem;

FIG. 10 is a block diagram showing a mobile phone terminal;

DETAILED DESCRIPTION

Figure 1:
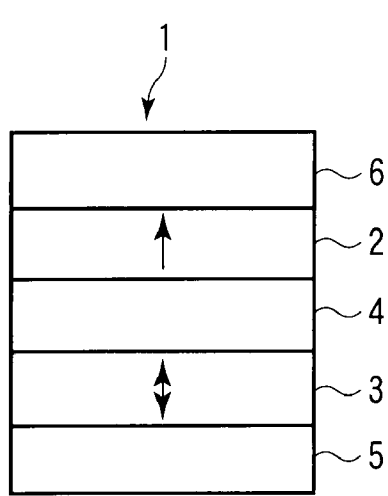
FIG. 1 shows a primary part in an MR element according to a first embodiment.

In general, according to one embodiment, a magnetoresistive element includes a first magnetic layer with a variable magnetization and an easy-axis in a perpendicular direction to a film surface, a second magnetic layer with an invariable magnetization and an easy-axis in the perpendicular direction, and a first nonmagnetic layer between the first and second magnetic layers. The first magnetic layer comprises a ferromagnetic material including an alloy in which Co and Pd, or Co and Pt are alternately laminated on an atomically close-packed plane thereof. The first magnetic layer has C-axis directing the perpendicular direction. And a magnetization direction of the first magnetic layer is changed by a current flowing through the first magnetic layer, the first nonmagnetic layer and the second magnetic layer.

The expression—alternately laminated—is defined by below.

When Co-layers and Pd-layers are alternately laminated, each of Co-layers and Pd-layers may comprise one atomic layer or several atomic layers, for example. The number of atomic layers of each of Co-layers and the number of atomic layers of each of Pd-layers may be the same or different from each other.

In addition, when Co-layers and Pt-layers are alternately laminated, each of Co-layers and Pt-layers may comprise one atomic layer or several atomic layers, for example. The number of atomic layers of each of Co-layers and the number of atomic layers of each of Pt-layers may be the same or different from each other.

—Basic concept—

A basic concept of a magnetoresistive element according to the embodiment will now be described.

In the following description, like reference numerals denote constituent elements having substantially the same functions and configurations, and a repeated explanation will be given only if needed. However, the drawings are schematic, and it should be noted that a relationship between a thickness and a planar dimension, a ratio of a thickness of each layer, etc. are different from actual values. Therefore, specific thicknesses or dimensions should be judged while considering the following description.

Further, the drawings of course include portions having different dimensional relationships or ratios. Furthermore, each embodiment described below exemplifies an apparatus or a method that embodies the technical concept of the present invention, and the technical concept of the present invention does not restrict a material, a shape, a configuration, arrangement and other aspects of each constituent component to those described below. The technical concept of the present invention can be modified in many ways within the scope of the claims.

First Embodiment

A first embodiment relates to a magnetoresistive element.

(1) Configuration of Magnetoresistive Element

FIG. 1 shows a primary part of a magnetoresistive element according to the first embodiment.

In FIG. 1, an arrow indicates a magnetization direction. The magnetoresistive element described in this specification and claims means a TMR (tunneling magneto-resistance effect) element in which a semiconductor or an insulator is used for a spacer layer. Furthermore, although the following drawing shows the primary part of the magnetoresistive element, it may include further layers as long as it has the illustrated configuration.

Magnetoresistive element 1 performs writing based on a spin injection magnetization reversal system. That is, magnetoresistive element 1 changes a relative angle of magnetizations of a storage layer and a fixed layer to a parallel state or an anti-parallel state (i.e., a relative minimum or a relative maximum of resistance) in accordance with a direction of a spin polarized current flowing through each layer in a film surface perpendicular direction, and associates each state with binary information "0" or "1" to store information.

As shown in FIG. 1, magnetoresistive element 1 has at least two magnetic layers 2 and 3 and nonmagnetic layer 4 provided between magnetic layers 2 and 3. Magnetic layer 3 has an easy-axis in a direction perpendicular to a film surface and rotates along a surface crossing the film surface. Magnetic layer 3 will be referred to as a storage layer (a free layer, a magnetic free layer, a magnetic variable layer, a recording layer) hereinafter. Detailed properties of the storage layer will be described later. Magnetization in the film surface perpendicular direction will be referred to as perpendicular magnetization hereinafter.

Magnetic layer 2 has an easy-axis in the direction perpendicular to the film surface and a magnetization direction fixed to the storage layer. Magnetic layer 2 will be referred to as a fixed layer (a magnetic fixed layer, a reference layer, a magnetic reference layer, a pinned layer, a magnetic pinned layer, a base layer, a magnetic base layer) hereinafter. Detailed properties of the fixed layer will be described later. It is to be noted that the magnetization direction of the fixed layer (magnetic layer 2) faces an opposite direction (an upper side) with respect to a substrate as a typical example in FIG. 1, but it may face a substrate direction (a lower side).

Nonmagnetic layer (a tunnel barrier layer) 4 is formed by an insulating film of, e.g., an oxide. Detailed properties of nonmagnetic layer 4 will be described later.

Magnetoresistive element 1 is a magnetoresistive element used for the spin injection write system. That is, at the time of writing, electrons in which spin information is stored are injected from the fixed layer (magnetic layer 2) to the storage layer (magnetic layer 3) by flowing a current from the fixed layer (magnetic layer 2) to the storage layer (magnetic layer 3) or from the storage layer (magnetic layer 3) to the fixed layer (magnetic layer 2) in the film surface perpendicular direction.

When a spin angular momentum of the injected electrons is moved to electrons in the storage layer (magnetic layer 3) in accordance with a spin angular momentum storage principle, the magnetization of the storage layer (magnetic layer 3) is reversed.

FIG. 1 shows a so-called top pin configuration in which the storage layer (magnetic layer 3) is formed on underlying layer 5 and the fixed layer (magnetic layer 2) is formed on nonmagnetic layer 4.

Underlying layer 5 may be further formed below the storage layer (magnetic layer 3). Underlying layer 5 is utilized to control the crystallinity, such as a crystalline orientation and a crystal grain diameter of each layer above the storage layer (magnetic layer 3), and detailed properties thereof will be described later.

Cap layer 6 may be further formed on the fixed layer (magnetic layer 2). Cap layer 6 mainly functions as a protective layer that prevents oxidation of the magnetic layer, for example.

In FIG. 1, no interface layer, described later, is interposed. The configuration shown in FIG. 1 can be used when magnetic materials constituting the storage layer (magnetic layer 3) and the fixed layer (magnetic layer 2) can develop a high TMR and have spin polarizability that is sufficient to enable high spin injection efficiency.

Figure 2:
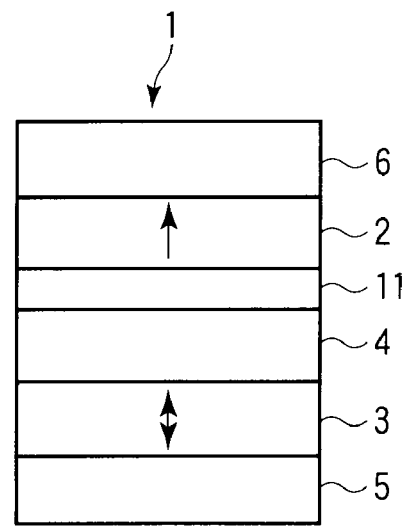
FIGS. 2 to 4 are views, each showing a modification of FIG. 1.

FIG. 2 shows a modification of the magnetoresistive element depicted in FIG. 1.

The configuration shown in FIG. 2 is different from the configuration depicted in FIG. 1 in that interface layer 11 is interposed between the fixed layer (magnetic layer 2) and nonmagnetic layer 4. Interface layer 11 is formed of a ferromagnetic material, and it has an effect of alleviating lattice mismatch on an interface between the fixed layer (magnetic layer 2) and nonmagnetic layer 4 and also has an effect of realizing a high TMR and a high spin injection efficiency by using a highly polarizable material.

It is to be noted that interface layer 11 between the fixed layer (magnetic layer 2) and nonmagnetic layer 4 may be removed and the interface layer may be interposed between the storage layer (magnetic layer 3) and nonmagnetic layer 4.

Figure 3:
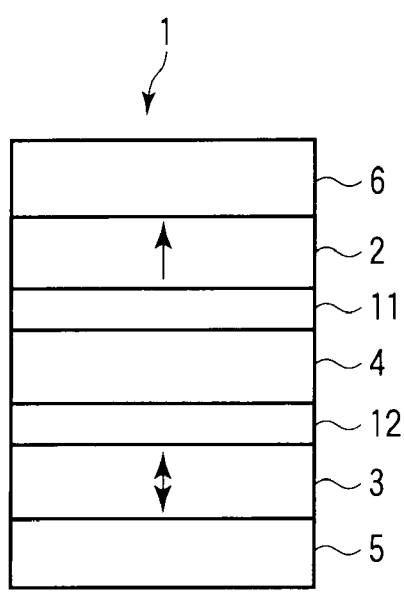

FIG. 3 shows a modification of the magnetoresistive element depicted in FIG. 1.

The configuration shown in FIG. 3 is different from the configuration depicted in FIG. 1 in that interface layer 11 and interface layer 12 are interposed between the fixed layer (magnetic layer 2) and nonmagnetic layer 4 and between the storage layer (magnetic layer 3) and nonmagnetic layer 4, respectively. Effects of interface layers 11 and 12 are the same as those depicted in FIG. 2.

Each of interface layers 11 and 12 is formed of a ferromagnetic material. Detailed properties of interface layers 11 and 12 will be described later.

Figure 4:
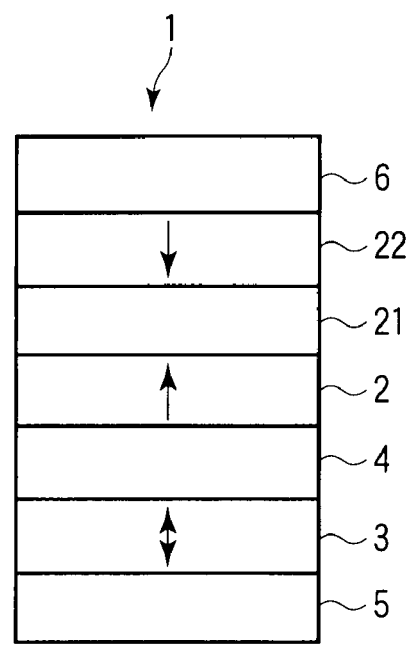

FIG. 4 shows a modification of the magnetoresistive element depicted in FIG. 1.

The configuration shown in FIG. 4 is different from the configuration depicted in FIG. 1 in that nonmagnetic layer 21 and bias layer (a shift adjustment layer) 22 are interposed between the fixed layer (magnetic layer 2) and cap layer 6.

Bias layer 22 is formed of a ferromagnetic material, and it is a perpendicular magnetization film having an easy-axis in the film surface perpendicular direction and fixed in an opposite direction of the magnetization direction of the fixed layer (magnetic layer 2). Bias layer 22 has an effect of adjusting an offset of storage layer reversal characteristics into the opposite direction, due to a leakage magnetic field from the fixed layer (magnetic layer 2), which becomes a problem at the time of processing the element or a subsequent stage.

Furthermore, in the configuration depicted in FIG. 4, like FIG. 2 and FIG. 3, interface layers 11 and 12 may be interposed between the storage layer (magnetic layer 3) and nonmagnetic layer 4 and between nonmagnetic layer 4 and the fixed layer (magnetic layer 2), respectively. Detailed properties of nonmagnetic layer 21 and bias layer 22 will be described later.

(2) Storage Layer

When using a perpendicular magnetization film as the storage layer (magnetic layer 3) in magnetoresistive element 1, since the shape anisotropy is not utilized as described above, an element shape can be reduced to be smaller than that in an in-plane magnetization type, and adopting a material having high perpendicular magnetic anisotropy enables achieving both miniaturization and a low current while maintaining resistance against thermal disturbance. Properties that the storage layer should have and a specific example of material selection will now be described in detail.

(2-1) Properties Storage Layer should have

When using a perpendicular magnetization material as the storage layer, its thermal disturbance index $\Delta$ takes a ratio of effective anisotropic energy $K_u^{\mathit{eff}} \cdot V$ and thermal energy $k_B T$ and it is represented as follows:

$$\Delta = K_u^{\mathit{eff}} \cdot V / k_B T \quad \text{(Expression 1)}$$
$$= (K_u - 2\pi N M_S^2) \cdot Va / K_B T$$

where $K_u$: a perpendicular magnetic anisotropic constant;

$M_S$: saturated magnetization

N: a demagnetization coefficient; and

Va: a magnetization reversal unit volume.

To avoid a problem that the magnetization sways due to the thermal energy (thermal disturbance), $\Delta > \sim 60$ is a necessary condition. However, when an element size is reduced or a film thickness is decreased while considering realization of a high capacity, Va becomes small, and there is a concern that storage cannot be maintained (=thermal disturbance) and becomes unstable.

Therefore, as the storage layer, selecting a material having a high perpendicular magnetic anisotropic constant $K_u$ and/or small saturated magnetization $M_S$ is desired.

On the other hand, a critical current $I_C$ required for magnetization reversal by spin injection writing based on the perpendicular magnetization system is generally represented as follows:

$$I_C \propto \alpha / \eta \cdot \Delta \quad \text{(Expression 2)}$$

where α: a magnetic relaxation constant; and

η: a spin injection efficiency coefficient (2-2) Storage Layer Material

As described above, to provide the perpendicular magnetization film and achieve both the high resistance against thermal disturbance and the magnetization reversal using a low current, it is preferable to adopt a material that has small saturated magnetization $M_S$, high magnetic anisotropy $K_u$ that is sufficient to maintain thermal disturbance index (A) and high polarizability.

A specific description will now be given hereinafter.

(2-2-1) Example of Storage Layer Material

The storage layer (magnetic layer 3) in magnetoresistive element 1 according to the first embodiment is formed of an alloy in which atomic layers including cobalt (Co) and palladium (Pd) are alternately laminated. To provide the perpendicular magnetization film, the alloy can be densely arranged within the film surface, namely, an fcc (111)-orientation can be provided, or growth can be effected in an hcp (001)-direction.

Specifically, appropriately selecting underlying layer 5 depicted in FIG. 1 to FIG. 4 enables controlling crystal orientation during crystal growth. Particulars and a specific fabrication method of underlying layer 5 will be described later.

FIG. 5 shows Pd the concentration dependence of an effective perpendicular anisotropic energy of a CoPd film.

An abscissa represents a Pd composition ratio, and an ordinate represents a magnetic anisotropic constant $K_u^{\text{eff}}$. It can be seen from this drawing that the high perpendicular magnetic anisotropy equal to or above $1 \times 10^7$ (erg/cc) is possible while changing the Pd composition ratio and the saturated magnetization $M_S$.

Even if miniaturization is performed, a magnetoresistive element that can show high thermal stability can be provided based on this high perpendicular magnetic anisotropy.

It is to be noted that the storage layer may include additive elements such as nickel (Ni) or vanadium (V).

(3) Underlying Layer

As described above in detail in regard to the storage layer, to form the perpendicular magnetization film whose easy-axis is a direction perpendicular to the film surface, a configuration where the atomically close-packed plane can be readily oriented must be adopted. That is, the crystal orientation must be controlled in such a manner that an fcc (111)-plane and an hcp (001)-plane can be oriented, and hence selection of an underlying layer material and a laminated structure is important.

(3-1) Laminated Structure of Underlying Layer

FIG. 6 is a cross-sectional view showing a laminated structure including the underlying layer and the storage layer (the magnetic layer).

This laminated structure is a structure in which, for example, Ta having a film thickness of approximately 5 nm is provided as contact layer 8 between Si substrate 7 having a thermally-oxidized film and underlying layer 5. Further, as the storage layer (magnetic layer 3), for example, CoPd having a film thickness of approximately 2 nm is provided on underlying layer 5. Structures above CoPd are as shown in FIG. 1 to FIG. 4.

Underlying layer 5 in the magnetoresistive element according to the first embodiment comprises underlying layers 31, 33 and 34 as magnetic layers and underlying layer 32 as nonmagnetic layer. It is preferable for each of underlying layers 31, 33 and 34 to be formed of, e.g., an Ru layer having a film thickness of approximately 3 nm or a Pt layer having a film thickness of approximately 3 nm.

Specific materials of underlying layers 31 to 34 will be described later.

(3-2) Materials of Underlying Layers

As underlying layers 33 and 34, a metal having a dense configuration is used.

As a metal having a dense configuration, there is, e.g., Pt, Pd, Ir or Ru. Furthermore, for example, it is possible to use an alloy in which a metal is formed by two elements or three or more elements, like Pt—Pd or Pt—Ir, rather than one element. Moreover, since smoothness becomes poor when a film thickness is too large, it is preferable for a film thickness range to be 30 nm or below.

In underlying layer 5, underlying layer 31 is used for the purpose of improving the smoothness and the crystal orientation of each metal having the dense configuration of the underlying layer 33 or 34.

Specifically, there is, e.g., Ru. Additionally, when a film thickness of underlying layer 31 is too large, film formation takes time, which can be a cause of deterioration in productivity. Further, when this film thickness is too small, the effect of the above-described orientation control is lost, and hence it is preferable for this film thickness to fall within the range of 1 to 10 nm.

(4) Nonmagnetic Layer

As a material of nonmagnetic layer 4 in the magnetoresistive element according to the first embodiment, an oxide having an NaCl structure is preferable. Specifically, there are, e.g., MgO, CaO, SrO, TiO, VO, NbO and others.

When each of these oxides having the NaCl structure is subjected to crystal growth on, for example, (i) an amorphous CoFeNiB alloy which includes any one of Fe, Co and Ni or two or more materials selected from these elements as main components or (ii) an alloy which has a body-centered cubic (BCC) structure and a (100)-preferred-orientation-plane and includes any one of Fe, Co and Ni or two or more materials selected from these elements as main components, a (100)-plane is apt to grow as a preferred orientation plane.

In particular, on a CoFe—X amorphous alloy (X is, e.g., B, C or N) having B, C or N added therein, the (100)-plane can be very easily preferentially oriented.

Further, when the magnetization of storage layer 3 and the magnetization direction of fixed layer 2 are anti-parallel, since a spin-polarized Δl band enables tunnel conduction, majority spin electrons alone contribute to the conduction. As a result, the conductivity of magnetoresistive element 1 is lowered, and a resistance value of the same increases.

Conversely, when the magnetization of storage layer 3 and the magnetization direction of the fixed layer 2 are parallel, since a Δl band that is not spin-polarized takes over the conduction, the conductivity of magnetoresistive element 1 increases, and the resistance value of the same decreases. Therefore, formation of the Δl band is a point to focus on in the development of a high TMR ratio.

To form the Δl band, matching of the (100)-plane of nonmagnetic layer 4 including an oxide having the NaCl structure and the interface between storage layer 3 and fixed layer 2 must be good.

To further improve the lattice matching on the (100)-plane of nonmagnetic layer 4 including an oxide having the NaCl structure, interface layer 11 and interface layer 12 may be interposed. In terms of forming the Δl band, it is more preferable to select materials with which the lattice mismatch on the (100)-plane of nonmagnetic layer 4 becomes 5% or below for interface layer 11 and interface layer 12.

(5) Fixed Layer

As the fixed layer (magnetic layer 2) in magnetoresistive element 1 depicted in FIG. 1 to FIG. 4, selecting a material with which the magnetization direction does not easily change with respect to the storage layer (magnetic layer 3) is preferable. That is, it is desirable to select a material that has high effective magnetic anisotropy $K_u^{eff}$ and high saturated magnetization $M_S$ and also has a high magnetic relaxation constant α. A specific material will be described later.

(5-1) Ordered Alloys

There is provided an ordered alloy which is an alloy including one or more elements selected from Fe, Co and Ni and one or more elements selected from Pt and Pd, the alloy having a crystal structure which is of an $L1_0$ type. For example, there are $Fe_{50}Pt_{50}$, $Fe_{50}Pd_{50}$, $Co_{50}Pt_{50}$, $Fe_{30}Ni_{20}Pt_{50}$, $Co_{30}Fe_{20}Pt_{50}$, $Co_{30}Ni_{20}Pt_{50}$ and others. These ordered alloys are not restricted to the above-described composition ratio.

An impurity element such as Cu (copper), Cr (chrome) or Ag (silver) or its alloy or insulator can be added to each of these ordered alloys to adjust the effective magnetic anisotropic energy and the saturated magnetization. Further, when using each of these alloys as the fixed layer (magnetic layer 2), especially when selecting a material having large lattice mismatch with respect to nonmagnetic layer 4, interposing interface layer 11 between nonmagnetic layer 4 and the fixed layer (magnetic layer 2) is preferable as shown in FIG. 2.

(5-2) Artificial Lattices

There is provided a structure in which an alloy including any one element or one or more elements selected from Fe, Co and Ni and an alloy including any one element or one or more elements selected from Cr, Pt, Pd, Ir, Rh, Ru, Os, Re Au and Cu are alternately laminated. For example, there are a Co/Pt artificial lattice, a Co/Pd artificial lattice, a CoCr/Pt artificial lattice, a Co/Ru artificial lattice, a Co/Os, Co/Au or Ni/Ci artificial lattice and others.

In these artificial lattices, when addition of elements into the magnetic layer, a film thickness ratio of the magnetic layer and the nonmagnetic layer and a lamination cycle are adjusted, the effective magnetic anisotropic energy and the saturated magnetization can be adjusted. Furthermore, when using each of these laminated films as the fixed layer (magnetic layer 2), the lattice mismatch with respect to nonmagnetic layer 4 is large in many cases, which is not preferable in terms of a high TMR.

In such a case, as shown in FIG. 2, interposing interface layer 11 between nonmagnetic layer 4 and the fixed layer (magnetic layer 2) is preferable.

(5-3) Disordered Alloys

There is provided a metal which includes cobalt (Co) as a main component and one or more elements selected from chrome (Cr), tantalum (Ta), niobium (Nb), vanadium (V), tungsten (W), hafnium (Hf), titanium (Ti), zirconium (Zr), platinum (Pt), palladium (Pd), iron (Fe) and nickel (Ni).

For example, there are a CoCr alloy, a CoPt alloy, a CoCrPt alloy, CoCrPtTa alloy, a CoCrNb alloy and others.

In each of these alloys, a percentage of a nonmagnetic element can be increased to adjust the effective magnetic anisotropic energy and the saturated magnetization. Moreover, when using each of these alloys as the fixed layer (magnetic layer 2), the lattice mismatch with respect to nonmagnetic layer 4 is large in many cases, which is not preferable in terms of a high TMR.

In such a case, as shown in FIG. 2, interposing interface layer 11 between nonmagnetic layer 4 and the fixed layer (magnetic layer 2) is preferable.

(6) Interface Layer

For the purpose of increasing a magnetoresistance ratio (a TMR ratio), each of interface layers 11 and 12 shown in FIG. 2 and FIG. 3 may be arranged on the interface of the magnetic layer (the fixed layer (magnetic layer 2), the storage layer (magnetic layer 3)) that is in contact with nonmagnetic layer 4 in magnetoresistive element 1 according to the first embodiment.

It is preferable for each of interface layers 11 and 12 to comprise a high-polarizability material which is specifically an alloy $(Co_{100-x}-Fe_x)_{100-y}B_y$ including Co, Fe and B where $x \geq 20$ at % and $0 < y \leq 30$ at %.

When using such a magnetic material for each of interface layers 11 and 12, the lattice mismatch between the fixed layer (magnetic layer 2) and nonmagnetic layer 4 and between the storage layer (magnetic layer 3) and nonmagnetic layer 4 can be alleviated. Additionally, since the high-polarizability material is adopted, an effect of realizing a high TMR and a high spin injection efficiency can be expected.

(7) Bias Layer

As shown in FIG. 4, nonmagnetic layer and bias layer (a shift adjustment layer) 22 may be arranged between fixed layer 2 and cap layer 6 in magnetoresistive element 1 according to the first embodiment. As a result, a shift of an inversion current in storage layer 3 caused due to a leakage magnetic field from fixed layer 2 can be eased and adjusted.

It is desirable for nonmagnetic layer 21 to have sufficient heat resistance to prevent fixed layer 2 and bias layer 22 from being mixed in a thermal process and a function of controlling crystal orientation when forming bias layer 22.

Further, since a distance between bias layer 22 and storage layer 3 increases when a film thickness of nonmagnetic layer 21 rises, a shift adjusting the magnetic field applied to the storage layer (magnetic layer 3) from bias layer 22 is reduced. Therefore, as the film thickness of nonmagnetic layer 21, 5 nm or a smaller value is desirable.

Bias layer 22 is formed of a ferromagnetic material having an easy-axis in the film surface perpendicular direction. Specifically, materials described in relation to the fixed layer (magnetic layer 2) can be used. However, since bias layer 22 is separated from the storage layer (magnetic layer 3) as compared with the fixed layer (magnetic layer 2), the film thickness of bias layer 22 or an intensity of the saturated magnetization $M_S$ must be set larger than that of the fixed layer (magnetic layer 2) in order to adjust the leakage magnetic field applied to the storage layer (magnetic layer 3) by using bias layer 22.

That is, assuming that the film thickness and the saturated magnetization of the fixed layer (magnetic layer 2) are $t_2$ and $M_{S2}$ and the film thickness and the saturated magnetization of bias layer 22 are $t_{22}$ and $M_{S22}$, the following relational expression must be satisfied.

$$M_{S2} \times t_2 < M_{S22} \times t_{22} \quad \text{(Expression 3)}$$

For example, assuming processing of an element size 50 nm, if a magnetic material having a saturated magnetization $M_S$ of 1000 emu/cc and a film thickness of 5 nm is utilized for the fixed layer (magnetic layer 2) to cancel out a shift of an inversion current, a film thickness of 3 nm is required for nonmagnetic layer 21, and bias layer characteristics having a saturated magnetization Ms of 1000 emu/cc and a film thickness of approximately 15 nm are required for bias layer 22. Furthermore, to obtain the above-described shift-canceling effect, magnetization directions of the fixed layer (magnetic layer 2) and bias layer 22 must be set to an anti-parallel state.

To satisfy this relationship, it is good enough to select a material that can satisfy a relationship of Hc2>Hc22 or Hc2<Hc22 between coercive force Hc2 of the fixed layer (magnetic layer 2) and coercive force Hc22 of bias layer 22. In this case, when the magnetization direction of the layer having a smaller coercive force is reversed by using Minor Loop magnetizing in advance, the magnetization directions of the fixed layer (magnetic layer 2) and bias layer 22 can be set to the anti-parallel state.

Moreover, when the fixed layer (magnetic layer 2) and bias layer 22 are subjected to antiferromagnetic coupling (SAF (Synthetic Anti-Ferromagnet) coupling) through nonmagnetic layer 21, the magnetization directions of the fixed layer (magnetic layer 2) and bias layer 22 can be likewise set to the anti-parallel state.

Specifically, for example, ruthenium (Ru) can be used as a material of nonmagnetic layer 21 to couple the magnetization directions of the fixed layer (magnetic layer 2) and bias layer 22 in the anti-parallel state. As a result, a leakage magnetic field from the fixed layer (magnetic layer 2) can be reduced by bias layer 22, whereby a shift of the inverse current in the storage layer (magnetic layer 3) can be decreased.

Consequently, unevenness in the inversion current of the storage layer (magnetic layer 3) can be reduced among elements.

As described above, according to the magnetoresistive element of the first embodiment, the magnetoresistive element for the spin injection write system that enables realization of thermal stability and magnetization reversal with a low current at the same time can be obtained.

Second Embodiment

A second embodiment relates to a magnetic random access memory (MRAM) using the magnetoresistive element according to the first embodiment, and shows a structural example thereof.

FIG. 7 is a circuit diagram showing a configuration an MRAM according to the second embodiment.

The MRAM includes memory cell array 40 having memory cells MC arranged in a matrix form. Bit line pairs BL and /Bl are arranged in memory cell array 40 to extend in a column direction. Further, word lines WL are arranged in memory cell array 40 to extend in a row direction.

A memory cell MC is arranged at each intersection of the bit line BL and the word line WL. Each memory cell MC includes magnetoresistive element 1 and selective transistor 41 formed of an N channel MOS transistor. One end of magnetoresistive element 1 is connected to the bit line BL. The other end of magnetoresistive element 1 is connected to a drain terminal of selective transistor 41. A gate terminal of selective transistor 41 is connected to the word line WL. A source terminal of selective transistor 41 is connected to the bit line /BL.

Row decoder 42 is connected to the word line WL. Write circuit 44 and read circuit 45 are connected to the bit line pairs BL and /BL. Column decoder 43 is connected to write circuit 44 and read circuit 45. Each memory cell MC is selected by row decoder 42 and column decoder 43.

Data is written into the memory cell MC as follows. First, to select the memory cell MC into which data is to be written, the word line WL connected to this memory cell MC is activated. As a result, selective transistor 41 is turned on.

Here, a bi-directional write current Iw is supplied to magnetoresistive element 1 in accordance with write data. Specifically, when supplying the write current Iw to magnetoresistive element 1 in a direction from a left-hand side toward a right-hand side, write circuit 44 applies a positive voltage to the bit line BL and a ground voltage to the bit line /BL. Further, when supplying the write current Iw to magnetoresistive element 1 in a direction from the right-hand side toward the left-hand side, write current 44 applies a positive voltage to the bit line /BL and applies a ground voltage to the bit line BL. In this manner, data "0" or data "1" can be written into the memory cell MC.

Then, data is read out from the memory cell MC as follows. First, selective transistor 41 in the memory cell MC to be selected is turned on. Read circuit 45 supplies a read current Ir to magnetoresistive element 1 in, e.g., a direction from the right-hand side toward the left-hand side. Furthermore, read current 45 detects a resistance value of magnetoresistive element 10 based on this read current Ir. In this manner, data stored in the magnetoresistive element 1 can be read out.

A configuration of the MRAM will now be described.

FIG. 8 is a cross-sectional view showing one memory cell MC.

An element isolation insulating layer is provided in a surface region of P-type semiconductor substrate 51, and the surface region of semiconductor substrate 51 where this element isolation insulating layer is not provided functions as an element region (an active area) where an element is formed. The element isolation insulating layer features, e.g., STI (Shallow Trench Isolation). To provide STI, for example, oxide silicon is used.

A source region S and a drain region D which are separated from each other are provided in the element region of semiconductor substrate 51. Each of the source region S and the drain region D comprises an $N^+$-type diffusion region that is formed by introducing an $N^+$-type impurity having a high concentration into semiconductor substrate 51. Gate electrode 41B is provided on semiconductor substrate 51 through gate insulating film 41A between the source region S and the drain region D. Gate electrode 41B functions as the word line WL. In this manner, selective transistor 41 is provided on semiconductor substrate 51.

Wiring layer 53 is provided on the source region S through contact 52. Wiring layer 53 functions as the bit line /BL. Lead line 55 is provided on the drain region D through contact 54. Magnetoresistive element 1 sandwiched between lower electrode 7 and upper electrode 9 is provided on lead line 55. Wiring layer 56 is provided on upper electrode 9. Wiring layer 56 functions as bit line BL. Moreover, a space between semiconductor substrate 51 and wiring layer 56 is filled with interlayer insulating layer 57 formed of, e.g., oxide silicon.

As described above in detail, according to the second embodiment, the MRAM can be realized by using magnetoresistive element 1. It is to be noted that magnetoresistive element 1 can be used as a domain wall displacement type magnetic memory besides a spin injection type magnetic memory.

The MRAM according to the second embodiment can be applied to various apparatuses. Some application examples of the MRAM will now be described hereinafter.

First Application Example

FIG. 9 shows a DSL data path unit extracted from a digital subscriber line (DSL) modem.

This modem includes programmable digital signal processor (DSP) 100, analog-digital (A/D) converter 110, digital-analog (D/A) converter 120, transmission driver 130, receiver amplifier 140 and other components.

In FIG. 9, a bandpass filter is omitted, and MRAM 170 and EEPROM 180 according to this embodiment are shown as various types of optional memories configured to hold a line code program (a program configured to select and operate a modem in accordance with coded subscriber line information, transmitting conditions and other factors (a line code: QAM, CAP, RSK, FM, AM, PAM, DWMT or the like) executed by the DSP) instead.

It is to be noted that this application example uses two types of memories, i.e., MRAM 170 and EEPROM 180 as memories configured to hold a line code program, but EEPROM 180 may be substituted by the MRAM. That is, the MRAM alone may be used without adopting the two types of memories.

Second Application Example

FIG. 10 shows a mobile phone terminal 300 as another application example.

Communicating unit 200, which realizes a communicating function, includes transmission/reception antenna 201, antenna common unit, receiver 203, a baseband processor 204, DSP 205 used as a sound codec, speaker (telephone receiver) 206, microphone (telephone transmitter) 207, transmitter 208, frequency synthesizer 209 and other components.

Additionally, controller 220 that controls each unit in this mobile phone terminal 300 is provided in this mobile phone terminal 300. Controller 220 is a microcomputer that is formed by connecting CPU 221, ROM 222, MRAM 223 and flash memory 224 according to this embodiment through bus 225. A program executed by CPU 221 or necessary data such as display fonts are stored in ROM 222 in advance.

MRAM 223 is mainly used as a work area, and it is utilized when storing, e.g., data which is being calculated during execution of a program by CPU 21 as required or when temporarily storing data which is transmitted/received between controller 220 and each unit. Further, flash memory 224 stores, e.g., immediately preceding setting conditions and other items even if a power supply of mobile phone terminal 300 is turned off, and stores setting parameters for the conditions when adopting a usage that is similarly set at the time of the next power supply ON operation.

As a result, even if the power supply of mobile phone terminal 300 is turned off, the stored setting parameters are not lost.

Furthermore, in this mobile phone terminal 300 are provided audio reproducing unit 211, external output terminal 212, LCD controller 213, display LCD (liquid crystal display) 214, ringer 215 that generates a ringing tone and other components. Audio reproducing unit 211 reproduces audio information (or audio information stored in later-described external memory 240) input to mobile phone terminal 300. The audio information to be reproduced can be fetched to the outside when it is transmitted to, e.g., a headphone or a portable speaker through external output terminal 212.

When audio reproducing unit 211 is provided in this manner, the audio information can be reproduced. LCD controller 213 receives display information from, e.g., CPU 221 via bus 225, converts it into LCD control information required to control LCD 214 and drives LCD 214 to effect display.

Moreover, in mobile phone terminal 300 are provided interface circuits (I/F) 231, 233 and 235, external memory 240, external memory slot 232, key operating unit 234, external input/output terminal 236 and other components. External memory 240 such as a memory card is inserted into external memory slot 232. This external memory slot 232 is connected to bus 225 via interface circuit (I/F) 231.

When slot 232 is provided in mobile phone terminal 300 in this manner, information in mobile phone terminal 300 can be written into external memory 240, or information stored in external memory 240 (e.g., audio information) can be input to mobile phone terminal 300.

Key operating unit 234 is connected to bus 225 through interface circuit (I/F) 233. Key input information input from key operating unit 234 is transmitted to, e.g., CPU 221. External input/output terminal 236 is connected to bus 225 via interface circuit (I/F) 233, and it functions as a terminal which is utilized when inputting various kinds of information from the outside to mobile phone terminal 300 or outputting information to the outside from mobile phone terminal 300.

It is to be noted that ROM 222, MRAM 223 and flash memory 224 are used in this application example, but flash memory 224 may be substituted by the MRAM, and ROM 222 may be likewise substituted by the MRAM.

Third Application Example

Each of FIG. 11 to FIG. 15 shows an example where the MRAM is applied to a card (an MRAM card) such as Smart-Media that stores media contents.

Figure 11:
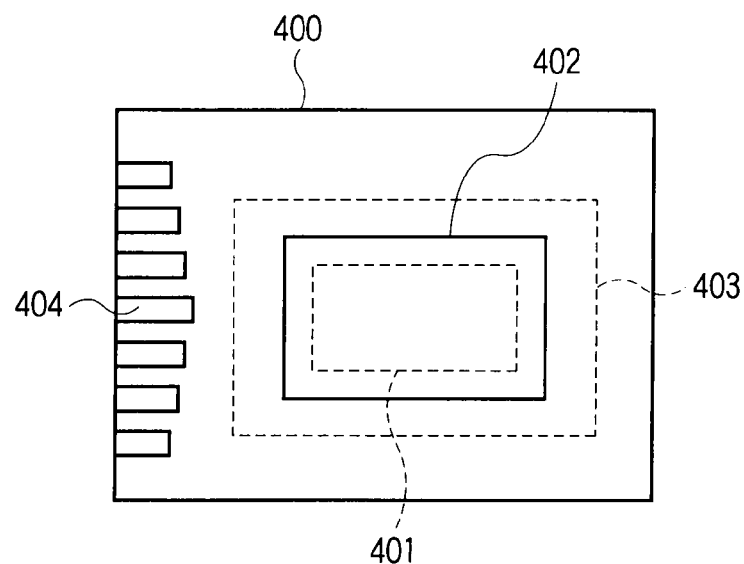
FIG. 11 is a top view showing an MRAM card.

As shown in FIG. 11, MRAM card main body 400 has built-in MRAM chip 401. In this card main body 400, opening portion 402 is formed at a position corresponding to MRAM chip 401, thereby exposing MRAM chip 401. Shutter 403 is provided to this opening portion 402 so that MRAM chip 401 can be protected by shutter 403 when carrying the MRAM card. This shutter 403 is formed of a material having an effect of blocking off an external magnetic field, e.g., a ceramic.

When data is copied, shutter 403 is opened to expose MRAM chip 401. External terminal 404 is configured to take out content data stored in the MRAM card to the outside.

Figure 12:
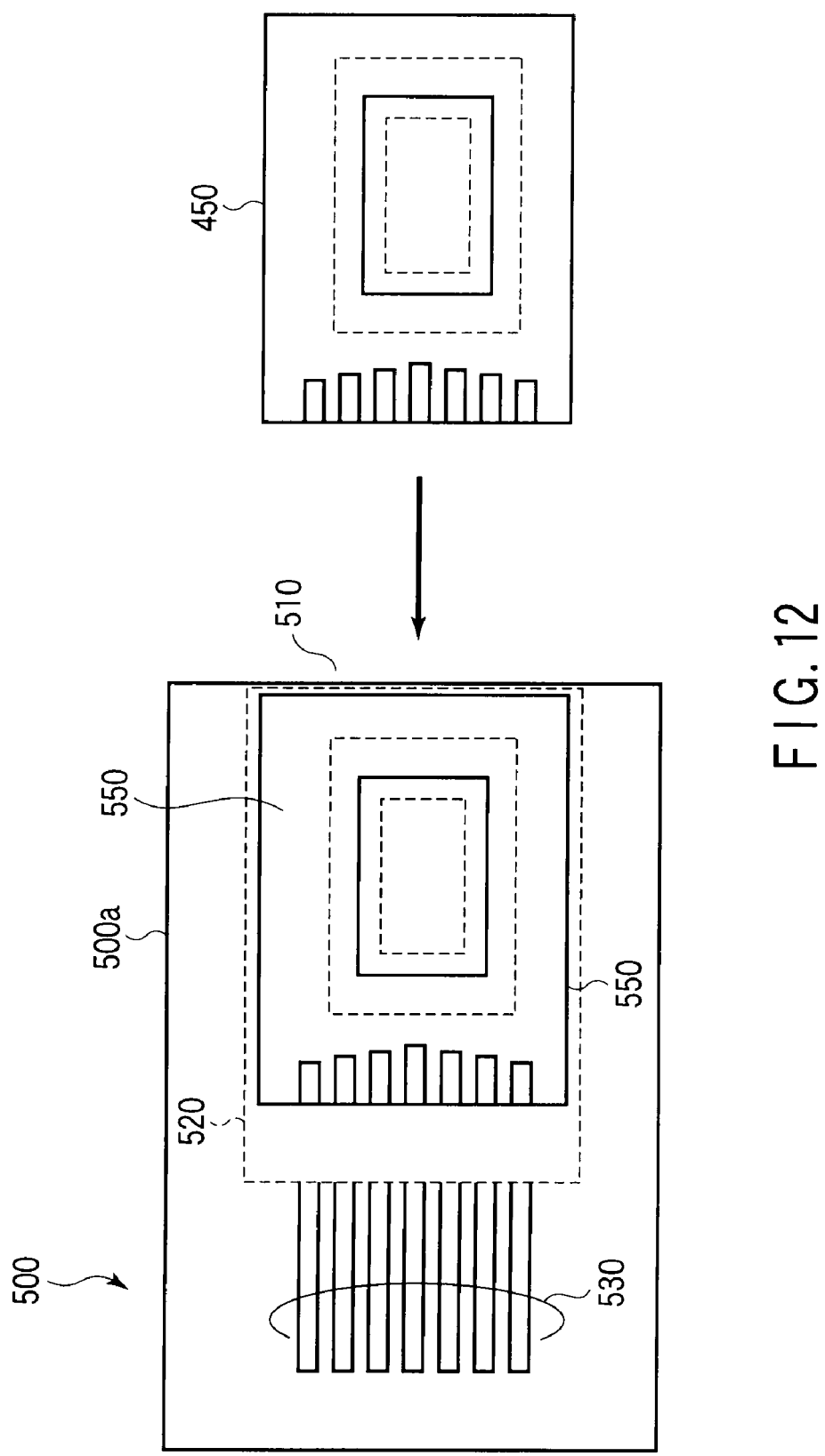
FIG. 12 is a plan view showing a transcription apparatus.
Figure 13:
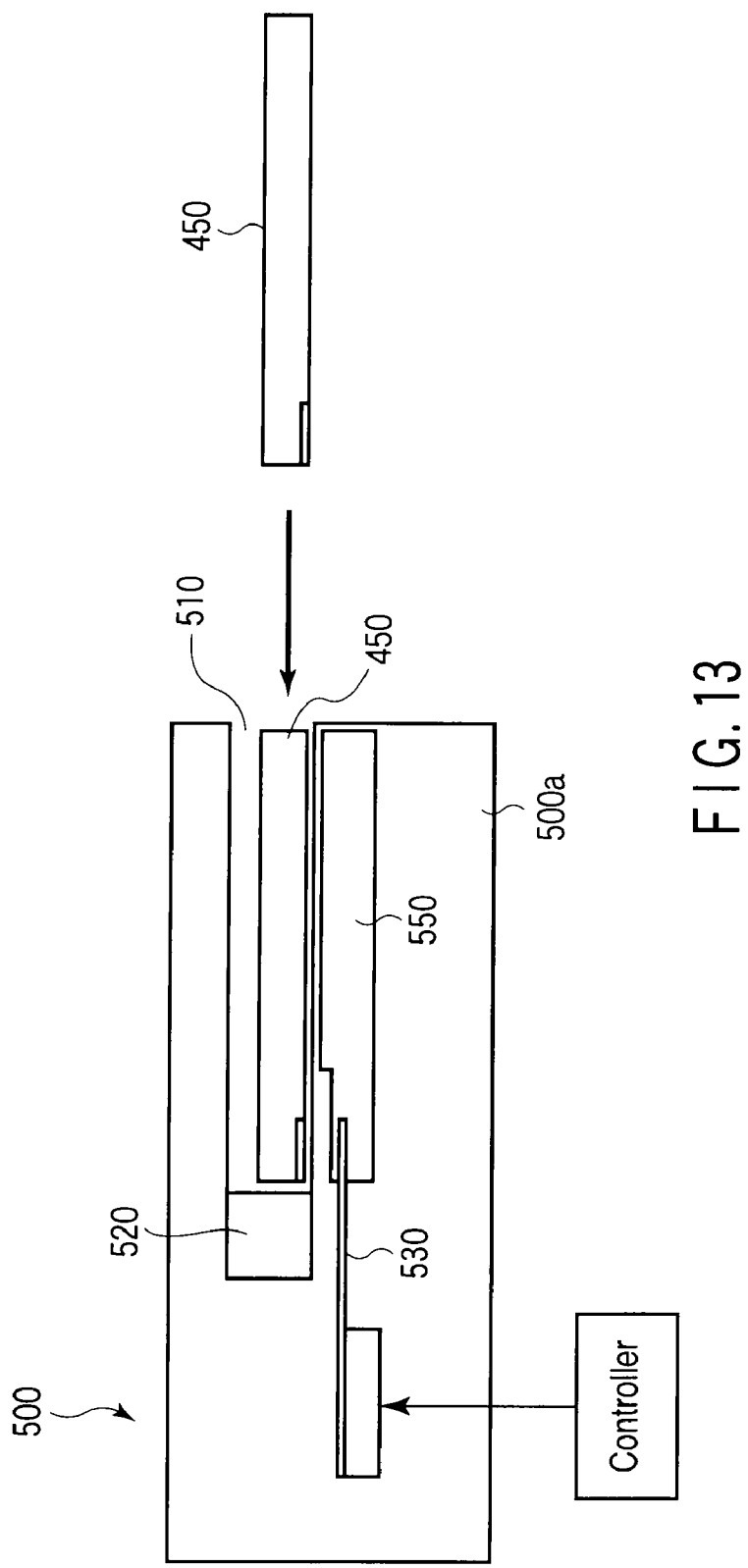
FIG. 13 is a cross-sectional view showing the transcription apparatus.

Each of FIG. 12 and FIG. 13 shows a card insertion type transcription apparatus configured to copy data to the MRAM card.

Data transcription apparatus 500 has accommodating unit 500a. This accommodating unit 500a accommodates first MRAM card 550. External terminal 530 that is electrically connected to first MRAM card 550 is provided in accommodating unit 550a, and data in first MRAM card 550 is rewritten by using this external terminal 530.

Second MRAM card 450 utilized by an end user is inserted from inserting portion 510 of transcription apparatus 500 and pushed in until it stops at a stopper 520 as indicated by an arrow. This stopper 520 also functions as a member configured to position first MRAM 550 and second MRAM card 450. When second MRAM card 450 is arranged at a predetermined position, controller 570 supplies to external terminal 530 a control signal which is utilized to copy data in first MRAM 550. As a result, the data in first MRAM 550 is copied to second MRAM card 450.

Figure 14:
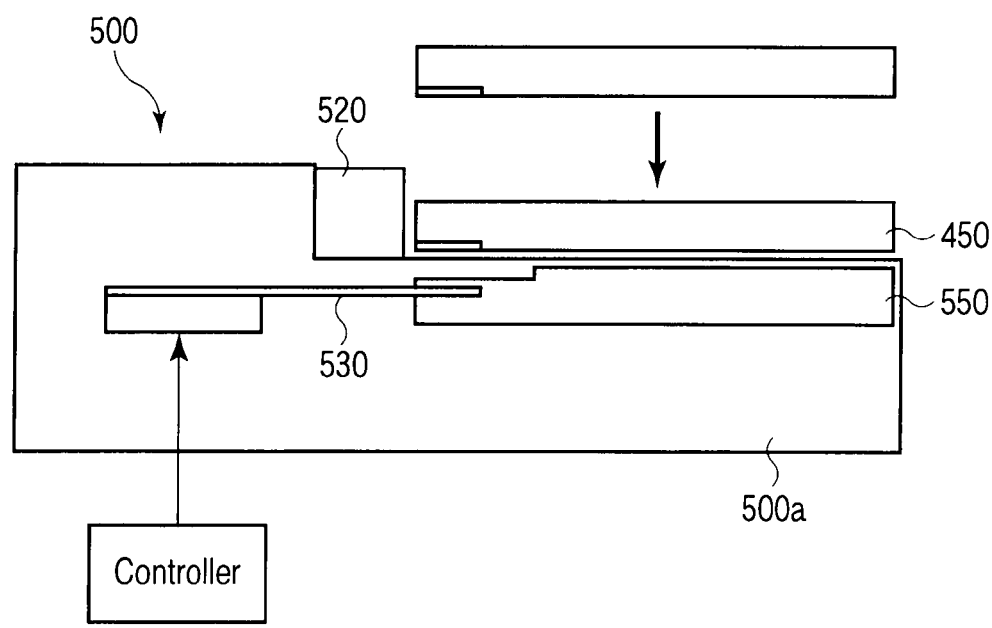
FIG. 14 is a cross-sectional view showing a set-in type transcription apparatus.

FIG. 14 is a cross-sectional view showing a set-in type transcription apparatus.

As indicated by an arrow, this transcription apparatus 500 is of a type that second MRAM card 450 is mounted on first MRAM 550 to be set in with stopper 520 being used as a marker. A transcription method is the same as that in the card insertion type, thereby omitting a description thereof.

Figure 15:
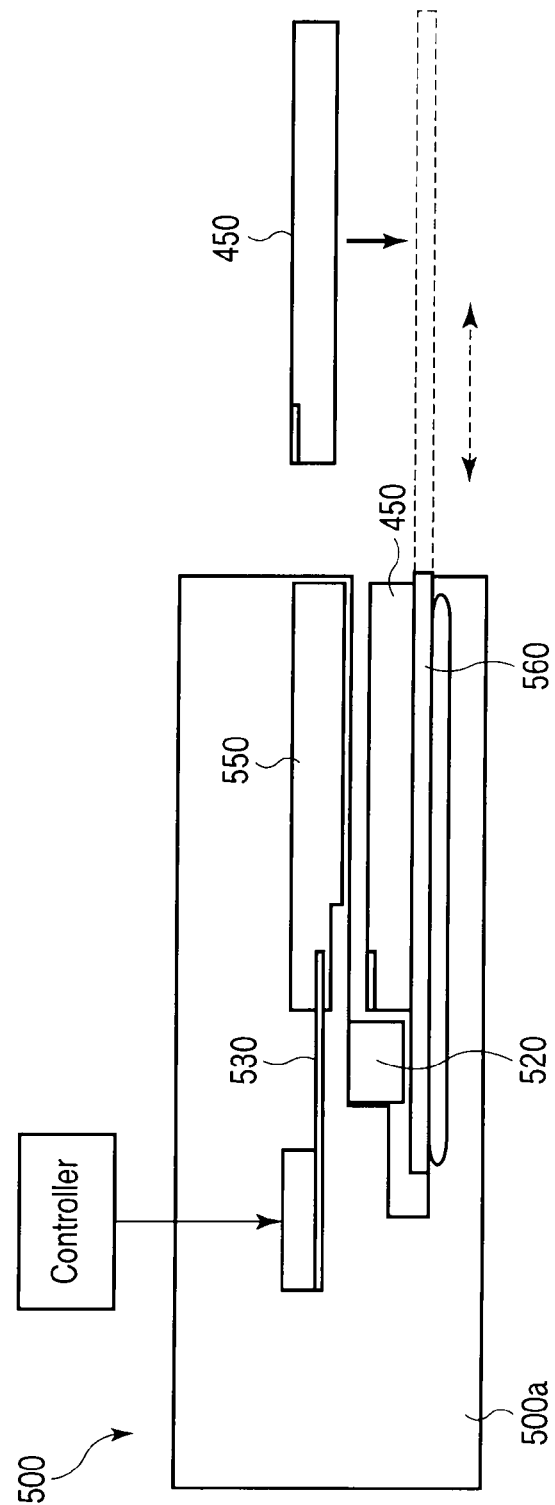
FIG. 15 is a cross-sectional view showing a slide type transcription apparatus.

FIG. 15 is a cross-sectional view showing a slide type transcription apparatus.

In this transcription apparatus 500, like a CD-ROM drive or a DVD drive, a saucer slide 560 is provided to transcription apparatus 500, and this saucer slide 560 moves as indicated by an arrow. When saucer slide 560 has reached a position indicated by a broken line, second MRAM card 450 is mounted onto saucer slide 560 to carry second MRAM card 450 into transcription apparatus 500.

A point that carriage is performed in such manner that an end portion of second MRAM card 450 comes into contact with stopper 520 and a transcription method are the same as those in the card insertion type, thereby omitting a description thereof.

Conclusion

As described above, according to the embodiments, the magnetoresistive element that has magnetic characteristics and output characteristics which are not deteriorated through a high-temperature heat treatment process at 300° C. or above and that is superior in heat resistance can be fabricated, and using this element enables providing a magnetic memory having a higher heat resistance than conventional examples.

The embodiments have considerable industrial merits with respect to, e.g., a high-speed random writable file memory, a portable terminal enabling high-speed download, a portable player enabling high-speed download, a broadcast equipment semiconductor memory, a drive recorder, a home video, a communication high-capacity buffer memory, a security camera semiconductor memory and other devices.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A magnetoresistive element comprising:
an underlying layer;
a first magnetic layer with a variable magnetization and an easy-axis in a perpendicular direction to a film surface, the first magnetic layer provided on the underlying layer;
a first nonmagnetic layer provided on the first magnetic layers; and
a second magnetic layer with an invariable magnetization and an easy-axis in the perpendicular direction, the second magnetic layer provided on the first nonmagnetic layer,
wherein the underlying layer has a close-packed structure,
the first magnetic layer comprises a ferromagnetic material including CoPd-alloy or CoPt-alloy in which an atomic layer of Co and an atomic layer of Pd or Pt are alternately stacked to an atomically close-packed plane thereof and C-axis directs to the perpendicular direction,
the CoPd-alloy or the CoPt-alloy is oriented in fcc (111)-plane or hcp (0001)-plane, and
a magnetization direction of the first magnetic layer is changed by a bi-directional current flowing through the first magnetic layer, the first nonmagnetic layer and the second magnetic layer.

2. The element of claim 1,
wherein the underlying layer includes at least one of Pt, Pd, Ir and Ru.

3. The element of claim 2,
wherein the underlying layer has one atomic layer.

4. The element of claim 2,
wherein the underlying layer has several atomic layers.

5. The element of claim 1,
wherein the first nonmagnetic layer comprises a magnesium oxide.

6. The element of claim 1, further comprising:
a third magnetic layer which reduces or adjusts a leakage magnetic field from the second magnetic layer; and
a second nonmagnetic layer between the second and third magnetic layers,
wherein the third magnetic layer has an easy-axis in the perpendicular direction.

7. The element of claim 6,
wherein saturated magnetization $M_{S2}$ and a film thickness $t_2$ of the second magnetic layer and saturated magnetization $M_{S3}$ and a film thickness $t_3$ of the third magnetic layer satisfy a relationship of $M_{S2} \times t_2 < M_{S3} \times t_3$, and
the magnetization directions of the second and third magnetic layers maintain an anti-parallel state.

8. The element of claim 1, further comprising:
an interface layer between the second magnetic layer and the first nonmagnetic layer,
wherein the interface layer is an alloy $(Co_{100-x}-Fe_x)_{100-y}B_y$ including Co, Fe and B, where $x \leq 20$ at % and $0 < y \leq 30$ at %.

9. The element of claim 8,
wherein the interface layer has one of a cubic structure and a tetragonal structure, and is (100)-oriented.

10. The element of claim 1, further comprising:
an interface layer between the first magnetic layer and the first nonmagnetic layer,
wherein the interface layer is an alloy $(Co_{100-x}-Fe_x)_{100-y}B_y$ including Co, Fe and B, where $x \geq 20$ at % and $0 < y \leq 30$ at %.

11. The element of claim 10,
wherein the interface layer has one of a cubic structure and a tetragonal structure, and is (100)-oriented.

12. The element of claim 1,
wherein the first magnetic layer includes nickel (Ni) or vanadium (V).

13. A magnetic memory comprising:
a memory cell array having memory cells,
wherein each of the memory cells comprises:
the element of claim 1; and
first and second electrodes sandwiching the element and applying the current to the element.

14. The memory of claim 13, further comprising:
a first conductive line which is electrically connected to the first electrode;
a second conductive line which is electrically connected to the second electrode; and
a write circuit which is electrically connected to the first and second conductive lines and applies the current to the element.

15. The memory of claim 14,
wherein each of the memory cells includes a selective transistor which is electrically connected between the second electrode and the write circuit.

* * * * *